(12) United States Patent
Berman et al.

(10) Patent No.: US 7,183,787 B2
(45) Date of Patent: Feb. 27, 2007

(54) CONTACT RESISTANCE DEVICE FOR IMPROVED PROCESS CONTROL

(75) Inventors: Michael J. Berman, West Linn, OR (US); Steven E. Reder, Boring, OR (US)

(73) Assignee: LSI Logic Corporation, Milpitas, CA (US)

( * ) Notice: Subject to any disclaimer, the term of this patent is extended or adjusted under 35 U.S.C. 154(b) by 109 days.

(21) Appl. No.: 10/723,701

(22) Filed: Nov. 26, 2003

(65) Prior Publication Data

US 2005/0110512 A1 May 26, 2005

(51) Int. Cl.
*G01R 31/26* (2006.01)
(52) U.S. Cl. ............. 324/765; 204/229.8; 205/81
(58) Field of Classification Search ................ 324/754, 324/755, 757, 761, 765; 257/48
See application file for complete search history.

(56) References Cited

U.S. PATENT DOCUMENTS

| | | | | |
|---|---|---|---|---|
| 4,486,705 A | * | 12/1984 | Stopper | 324/73.1 |
| 5,703,494 A | * | 12/1997 | Sano | 324/761 |
| 5,894,161 A | * | 4/1999 | Akram et al. | 257/48 |
| 6,004,440 A | * | 12/1999 | Hanson et al. | 204/279 |
| 6,071,388 A | * | 6/2000 | Uzoh | 204/287 |
| 6,114,869 A | * | 9/2000 | Williams et al. | 324/765 |
| 6,251,236 B1 | * | 6/2001 | Stevens | 204/224 R |
| 6,288,561 B1 | * | 9/2001 | Leedy | 324/760 |
| 6,476,630 B1 | * | 11/2002 | Whitten et al. | 324/765 |
| 6,480,013 B1 | * | 11/2002 | Nayler et al. | 324/754 |
| 6,517,689 B1 | * | 2/2003 | Hongo et al. | 204/228.7 |
| 6,755,946 B1 | * | 6/2004 | Patton et al. | 204/224 R |
| 6,788,082 B2 | * | 9/2004 | Hirao | 324/757 |

* cited by examiner

*Primary Examiner*—Minh N. Tang
(74) *Attorney, Agent, or Firm*—Trexler, Bushnell, Giangiorgi, Blackstone & Marr, Ltd.

(57) ABSTRACT

A device for measuring resistances associated with electrical contacts of a contact ring used in a semiconductor wafer electroplating process. The device includes a substrate and a conductive pattern on the substrate. The conductive pattern is electrically contactable with the electrical contacts of the contact ring. Resistance measurement circuitry is connected to the conductive pattern. The resistance measurement circuitry is configured to send test signals to the conductive pattern, receive signals from the conductive pattern, and measure the resistances associated with the electrical contacts of the contact ring. A method of using such a device to measure resistances associated with electrical contacts of a contact ring used in a semiconductor wafer electroplating process is also provided.

18 Claims, 4 Drawing Sheets

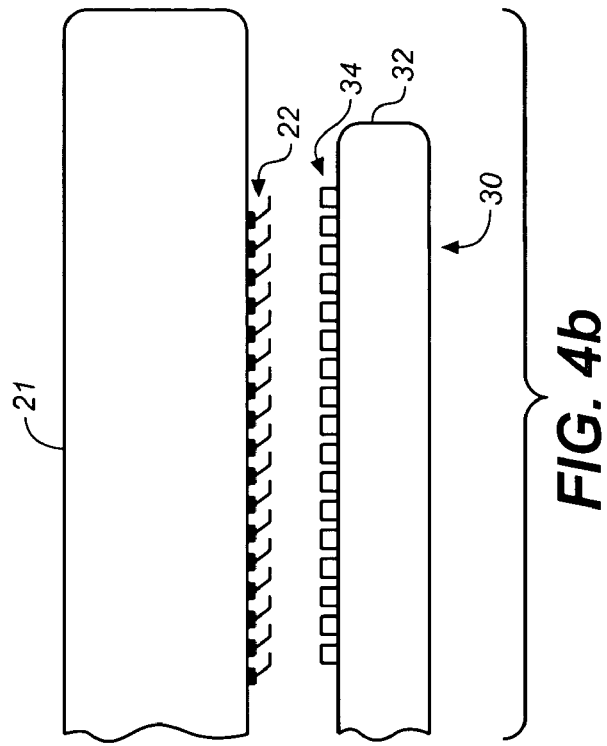
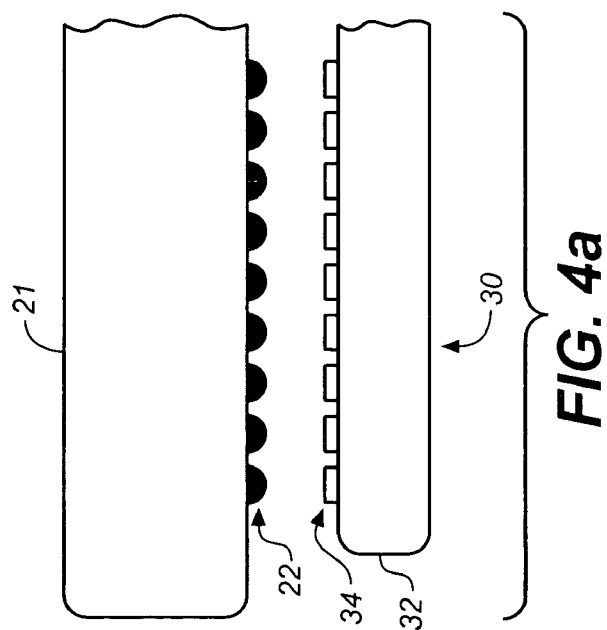

CONTACT RESISTANCE DEVICE FOR IMPROVED PROCESS CONTROL

BACKGROUND

Electroplating (often called "electrodeposition") is a process for depositing an electrically conductive material onto an item. In the semiconductor industry, electroplating is often used to apply a layer of copper (or other highly conductive material) to a substrate (i.e., a wafer). Specifically, as shown in FIG. 1, the wafer 10 is placed in a container 12 which holds an electrolyte solution 14, and an electrical potential is applied (using a voltage source 16) between a conducting area on the wafer 10 and a counter electrode 18 (i.e., anode) in the liquid. This causes a chemical redox process to take place, resulting in the formation of a layer of copper on the wafer 10.

To facilitate the deposition process, the surface of the wafer 10 must have an electrically conducting coating before being immersed in the electrolyte bath 14, and electrical contact must be made with the wafer 10 (to complete the circuit) before deposition can take place. As shown in FIG. 1, to facilitate electrical contact with the wafer 10, a contact ring 20 is typically used, where the contact ring 20 includes a top portion 21 and a bottom portion 23, and the top portion includes electrical connectors or contacts 22. The wafer 10 is placed in the contact ring 20 and a backing plate (not specifically shown in FIG. 1) is used to apply pressure, causing the electrical contacts 22 of the top portion 21 of the contact ring 20 to electrically contact the electrically conducting coating on the wafer 10. Thereafter, an electrical potential is applied, resulting in the formation of a layer of copper (of desired thickness) on the wafer 10.

The fact that the wafer must be in electrical contact with the electrical contacts of the contact ring to enable deposition, leads to problems. The electrical contacts of the contact ring often develop a build up or wear which, in turn, causes localized high contact resistance between the wafer to be plated and the contact ring. When this occurs, a wafer non-uniformity during the deposition process can occur (i.e., copper will be deposited unevenly on the wafer).

A common, currently used solution to the problem is to painstakingly troubleshoot the hardware to determine the cause of the non-uniformity. This can be quite time-consuming. Additionally, it often results in unnecessary expense in that sometimes parts are replaced that are not the true cause of the problem. As an example, presently it is quite costly to replace a contact ring and anode in troubleshooting the problem. They have to replaced in pairs, so at a minimum, if this is the chosen course of action, it would be costly, and 16 to 24 man hours would be required. Furthermore, during the work, no wafers can be processed using the tool.

OBJECTS AND SUMMARY

An object of an embodiment of the present invention is to provide an apparatus and method which can be used to quickly troubleshoot why a deposition non-uniformity is occurring in an electroplating process.

Another object of an embodiment of the present invention is to provide an apparatus and method which can be used to avoid incurring unnecessary expense in troubleshooting why non-uniformities are occurring in an electroplating process.

Another object of an embodiment of the present invention is to provide an apparatus and method which can be used to measure the contact resistance of electrical contacts of a contact ring.

Briefly, an in accordance with at least one of the foregoing objects, an embodiment of the present invention provides a device for measuring resistances associated with electrical contacts of a contact ring used in a semiconductor wafer electroplating process. The device includes a substrate and a conductive pattern on the substrate. The conductive pattern is electrically contactable with the electrical contacts of the contact ring. Resistance measurement circuitry is connected to the conductive pattern. The resistance measurement circuitry is configured to send test signals to the conductive pattern, receive signals from the conductive pattern, and measure the resistances associated with the electrical contacts of the contact ring.

The substrate can be, for example, a silicon substrate, a metal substrate fabricated to accomplish the desired measurements, or a substrate formed of some other suitable material. The resistance measurement circuitry may be configured to communicate signals to an external device, where the signals relate to resistances of the electrical contacts of the contact ring. The resistance measurement circuitry may include a battery configured to power the resistance measurement circuitry, input/output circuitry, resistance determination circuitry, and multiplexer circuitry, wherein the input/output circuitry is configured to initiate the sending of test signals, and the multiplexer circuitry is configured to send the test signals to the conductive pattern on the substrate in a pre-determined order. For example, the input/output circuitry may be configured to provide a signal to the multiplexer circuitry, thereby causing the multiplexer circuitry to start sending test signals to the conductive pattern on the substrate. The resistance determination circuitry may be configured to measure resistances from the conductive pattern and provide information to the input/output circuitry, which may be configured to communicate signals to the external device, where the signals relate to resistances of the electrical contacts of the contact ring.

A method of using such a device to measure resistances associated with electrical contacts of a contact ring used in a semiconductor wafer electroplating process can also be provided, wherein the method includes electrically contacting at least a portion of the conductive pattern on the substrate with electrical contacts of the contact ring, and having the device send test signals to the conductive pattern, receive signals from the conductive pattern, and measure the resistances associated with the electrical contacts of the contact ring. As the device is being used to measure the resistances, the device may be used to transmit signals to an external device, where the signals relate to resistances of the electrical contacts of the contact ring. Once the resistances have been measured, the device can be removed from the contact ring, at least one of the electrical contacts of the contact ring can be cleaned, and the device can be used again to measure the resistances associated with the electrical contacts of the contact ring.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which:

FIGS. 4a and 4b are side views which illustrate the device of FIG. 2 electrically contacting electrical contacts on a contact ring, the two Figures showing the two major types of contacts currently used in the industry;

DETAILED DESCRIPTION OF THE ILLUSTRATED EMBODIMENT

Figure 1:
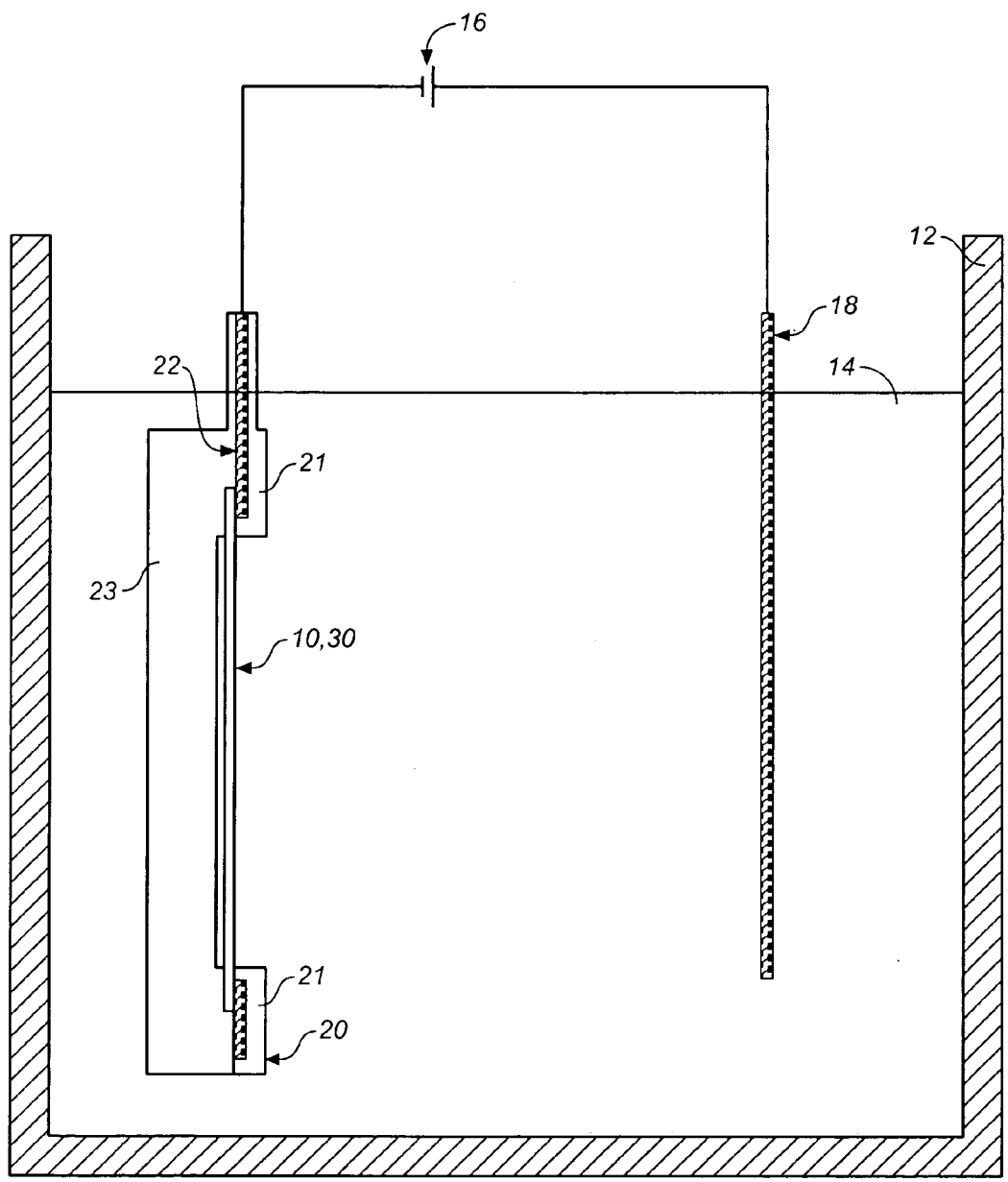
FIG. 1 is a diagram which illustrates a semiconductor wafer electroplating process.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

An embodiment of the present invention provides a device for measuring resistances associated with electrical contacts of a contact ring used in a semiconductor wafer electroplating process. The device can be used to quickly troubleshoot why a deposition non-uniformity is occurring in an electroplating process. The device can also be used to avoid incurring unnecessary expense in the troubleshooting process.

Figure 2:
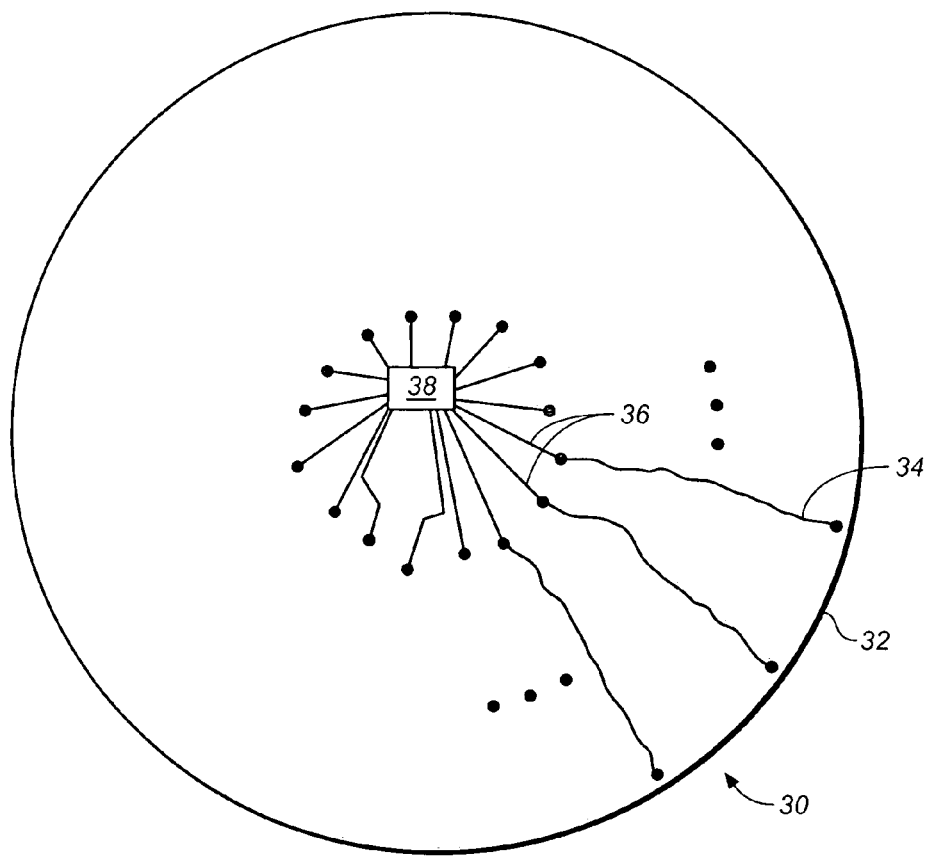
FIG. 2 is a top plan view of a device which is in accordance with an embodiment of the present invention.

As shown in FIG. 2, the device 30 includes a substrate 32 (i.e., a wafer), which can be a silicon substrate, a metal substrate fabricated to accomplish the desired measurements, or a substrate formed of some other, suitable material. A conductive pattern 34 (such as a copper pattern, or some other highly conductive film) is etched or otherwise provided on the substrate 32, preferably in the shape of electrical contacts 22 on the top portion 21 of a contact ring 20 (see FIGS. 1 and 4). Preferably, the conductive pattern 34 terminates with wires 36 attached to the wafer 32 leading to a connector. More specifically, preferably the conductive pattern 34 is connected to resistance measurement circuitry 38, where the resistance measurement circuitry 38 is configured to send test signals to the conductive pattern 34, receive signals from the conductive pattern 34, and measure the resistances associated with the electrical contacts 22 of top portion 21 of the contact ring 20.

Figure 3:
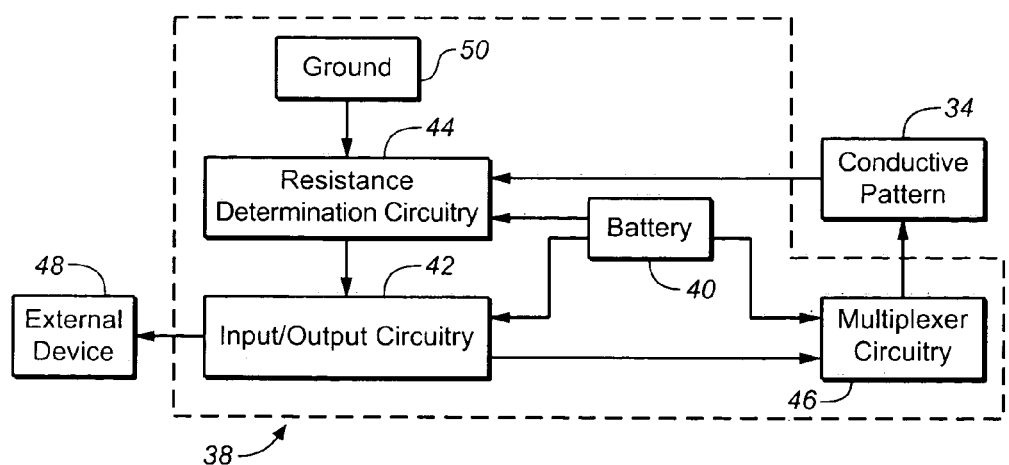
FIG. 3 is a circuit diagram of resistance measurement circuitry of the device which is shown in FIG. 2.

As shown in FIG. 3, the resistance measurement circuitry 38 may include a battery 40 for powering the resistance measurement circuitry 38. The battery 40 may be a dc battery on the substrate, or power may be supplied by a wire from the outside (i.e., the battery may not physically be on the substrate). The resistance measurement circuitry 38 may also include input/output circuitry 42, resistance determination circuitry 44, and multiplexer circuitry 46, where the input/output circuitry 42 is configured to send a start signal to the multiplexer circuitry 46 and is configured to thereafter receive resistance measurement information from the resistance determination circuitry 44 and communicate resistance information to an external device 48, such as via a wireless transmission or via a set of wires. Preferably, the multiplexer circuitry 46 is configured to send test signals to the conductive pattern 34, in a pre-determined order, once the multiplexer circuitry 46 has received the start signal from the input/output circuitry 42. Preferably, the resistance determination circuitry 44 is configured to take the power 40 (i.e. from an on-board battery or outside power source) and use the power to measure the resistances from the conductive pattern 34 to the ground 50 of the tool being used.

In use, as shown in FIG. 4a and 4b, the device 30 is electrically connected to the electrical contacts 22 of the contact ring 20 (FIGS. 4a and 4b show the two most commonly used contact types). Backing plate pressure is applied, and measurements of the resistances between the conductive pattern 34 on the substrate 32 and the electrical contacts 22 of the contact ring 20 are taken using the device 30. The resistances could be checked automatically (if an adapter were incorporated into the tool for diagnostics) or externally via a manually adapted meter. The contact resistance is measured and, if an area of high contact resistance is found, the contact ring 20 could be cleaned or replaced (see FIG. 6). The device 30 may communicate the resistance information to an external device 48 (see FIG. 3) via wireless communication, if the device is so configured.

Figure 5:
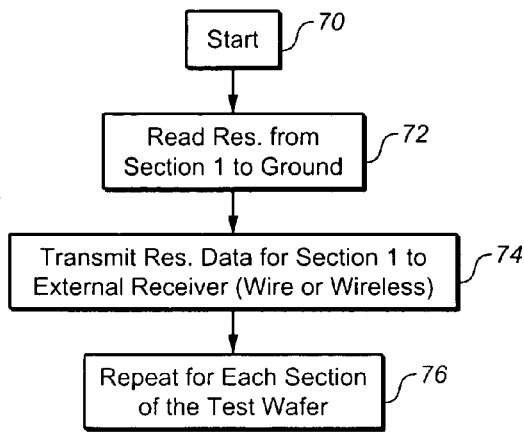
FIG. 5 is a flow chart showing basic operation of the device shown in FIG. 2.

As shown in FIG. 5, the device can be configured to measure resistances in sections (i.e., sections of the conductive pattern 34), wherein the device starts the measurement sequence (box 70 in FIG. 5), reads the resistance from section one to ground (box 72 in FIG. 5), transmits the resistance data from section 1 to an external receiver 48 (via one or more wires or via wireless communication) (box 74 in FIG. 5), and repeats the process for each section of the device (i.e., each section of the conductive pattern 34) (box 76 in FIG. 5).

Figure 6:
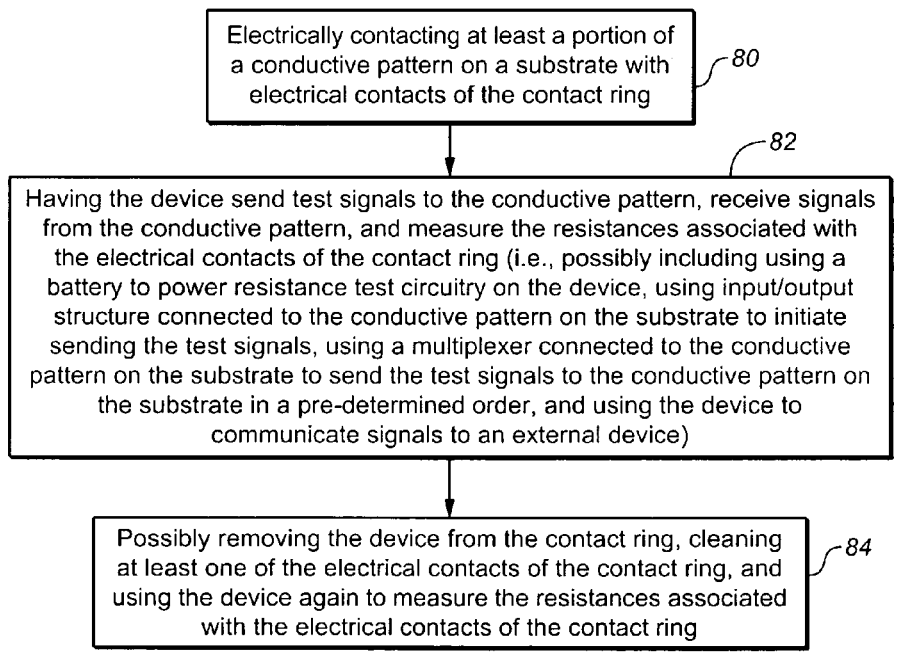
FIG. 6 is a flow chart illustrating a method of using the device shown in FIG. 2 to measure resistances associated with electrical contacts of a contact ring.

FIG. 6 illustrates a method of using the device 30 shown in FIG. 2 to measure resistances associated with electrical contacts 22 of a contact ring 20, and is self-explanatory, especially in light of the foregoing description. As shown in FIG. 6, at least a portion of the conductive pattern is electrically contacted with electrical contacts of a contact ring (box 80 in FIG. 6). Then, the device is used to measure the resistances associated with the electrical contacts of the contact ring (box 82 in FIG. 6). Then, the device can be removed, electrical contacts of the contact ring cleaned, and the device used again to measure the resistances associated with the electrical contacts of the contact ring (box 84 in FIG. 6).

While a preferred embodiment of the present invention is shown and described, it is envisioned that those skilled in the art may devise various modifications of the present invention without departing from the spirit and scope of the appended claims. For example, while the present invention was described with regard to troubleshooting non-uniformities in an electroplating process, the device 30 can also be used as a go/no-go test for contact ring resistance. Additionally, the invention can be useful for other types of systems in which there is contact with a wafer. The invention can be applied to any type of machine that makes contact to a wafer or depends on contact resistance for processing.

What is claimed is:

1. A device for measuring resistances associated with electrical contacts, said device comprising: a round substrate such that the substrate is configured to mount between a top portion and a bottom portion of a contact ring which is configured for use in a semiconductor wafer electroplating process; a conductive pattern on said substrate, said conductive pattern configured to electrically contact the electrical contacts of the contact ring; and resistance measurement circuitry on the substrate and surrounded by the conductive pattern, said resistance measurement circuitry connected to said conductive pattern, said resistance measurement circuitry configured to not only send test signals to said conductive pattern, but also configured to receive signals from the conductive pattern and measure the resistances associated with the electrical contacts of the contact ring.

2. A device as recited in claim 1, wherein said substrate is at least one of a silicon substrate and a metal substrate.

3. A device as recited in claim 1, wherein said resistance measurement circuitry is configured to communicate signals to an external device, said signals relating to resistances of the electrical contacts of the contact ring.

4. A device as recited in claim 1, said resistance measurement circuitry comprising a battery configured to power said resistance measurement circuitry.

5. A device as recited in claim 1, said resistance measurement circuitry comprising input/output circuitry configured to initiate the sending of test signals to the conductive pattern and communicate signals to an external device relating to resistances of the electrical contacts of the contact ring.

6. A device as recited in claim 1, said resistance measurement circuitry comprising multiplexer circuitry connected to said conductive pattern on the substrate and configured to send the test signals to the conductive pattern on the substrate in a pre-determined order.

7. A device as recited in claim 1 said resistance measurement circuitry comprising multiplexer circuitry connected to said conductive pattern on the substrate, and input/output circuitry connected to said multiplexer circuitry.

8. A device as recited in claim 7, wherein the multiplexer circuitry is configured to send the test signals to the conductive pattern on the substrate in a pre-determined order.

9. A device as recited in claim 7, wherein the input/output circuitry is configured to provide a signal to the multiplexer circuitry, thereby causing the multiplexer circuitry to start sending test signals to the conductive pattern on the substrate.

10. A device as recited in claim 1, said resistance measurement circuitry comprising multiplexer circuitry connected to said conductive pattern on the substrate, input/output circuitry connected to said multiplexer circuitry, and resistance determination circuitry connected to said conductive pattern and to said input/output circuitry, said resistance determination circuitry configured to determine resistances based on signals received from the conductive pattern.

11. A device as recited in claim 9, wherein the input/output circuitry is configured to communicate signals to an external device, said signals relating to resistances of the electrical contacts of the contact ring.

12. A method of using a device to measure resistances associated with electrical contacts, the device comprising a substrate, a conductive pattern on the substrate, and resistance measurement circuitry on the substrate and surrounded by the conductive pattern, said resistance measurement circuitry connected to the conductive pattern, said method comprising mounting the substrate between a top portion and a bottom portion of a contact ring which is configured for use in a semiconductor wafer electroplating process thereby electrically contacting at least a portion of the conductive pattern on the substrate with electrical contacts of the contact ring; having the resistance measurement circuitry on the substrate not only send test signals to the conductive pattern which surrounds the resistance measurement circuitry, but also receive signals from the conductive pattern, and measure the resistances associated with the electrical contacts of the contact ring.

13. A method as recited in claim 12, further comprising using the device to communicate signals to an external device, said signals relating to resistances of the electrical contacts of the contact ring.

14. A method as recited in claim 12, further comprising using a battery to power the resistance measurement circuitry on the device.

15. A method as recited in claim 12, using input/output circuitry connected to the conductive pattern on the substrate to initiate sending the test signals and to communicate signals to an external device, said signals relating to resistances of the electrical contacts of the contact ring.

16. A method as recited in claim 12, further comprising using multiplexer circuitry connected to the conductive pattern on the substrate to send the test signals to the conductive pattern on the substrate in a pre-determined order.

17. A method as recited in claim 12, further comprising using resistance determination circuitry connected to said conductive pattern to determine resistances based on signals received from the conductive pattern.

18. A method as recited in claim 12, further comprising removing the device from the contact ring, cleaning at least one of the electrical contacts of the contact ring, and using the device again to measure the resistances associated with the electrical contacts of the contact ring.

* * * * *